United States Patent
Sakaue et al.

(10) Patent No.: US 10,115,611 B2
(45) Date of Patent: Oct. 30, 2018

(54) SUBSTRATE COOLING METHOD, SUBSTRATE TRANSFER METHOD, AND LOAD-LOCK MECHANISM

(71) Applicant: TOKYO ELECTRON LIMITED, Tokyo (JP)

(72) Inventors: Hiromitsu Sakaue, Yamanashi (JP); Shinya Okano, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/334,179

(22) Filed: Oct. 25, 2016

(65) Prior Publication Data
US 2017/0117169 A1 Apr. 27, 2017

(30) Foreign Application Priority Data
Oct. 26, 2015 (JP) .................. 2015-209766

(51) Int. Cl.
*H01L 21/67* (2006.01)
*H01L 21/677* (2006.01)

(52) U.S. Cl.
CPC .. *H01L 21/67109* (2013.01); *H01L 21/67167* (2013.01); *H01L 21/67173* (2013.01); *H01L 21/67201* (2013.01); *H01L 21/67742* (2013.01)

(58) Field of Classification Search
CPC ......... H01L 21/67109; H01L 21/67167; H01L 21/67173; H01L 21/67201; H01L 21/67742
See application file for complete search history.

(56) References Cited

U.S. PATENT DOCUMENTS

| 8,585,831 B2 * | 11/2013 | Matsui ............ H01L 21/02101 134/26 |
| 9,305,820 B2 * | 4/2016 | Nabeta ............ H01J 37/32082 |
| 2002/0020355 A1 | 2/2002 | Saeki et al. |
| 2010/0122774 A1 * | 5/2010 | Makabe ............ H01J 37/32431 156/345.52 |

(Continued)

FOREIGN PATENT DOCUMENTS

| JP | 2000-208589 | 7/2000 |
| JP | 2000-317761 A | 11/2000 |

(Continued)

*Primary Examiner* — Kaitlin S Joerger

(57) ABSTRACT

A substrate cooling method is for, using a load-lock mechanism for controlling a pressure therein between a first pressure close to an atmospheric pressure and a second pressure in a vacuum state, cooling a substrate transferred from the second module to the first module. The method includes maintaining a pressure in the chamber to the second pressure, allowing the chamber to communicate with a second module, and loading the substrate into the chamber; locating the substrate to a cooling position close to the cooling member; exhausting the chamber such that the pressure in the chamber becomes a third pressure where a region between a surface of the cooling member and a backside of the substrate satisfies a molecular flow condition. The method further includes introducing a purge gas into the chamber to increase the pressure in the chamber to the first pressure, and cooling the substrate by the cooling member.

16 Claims, 7 Drawing Sheets

(56) References Cited

U.S. PATENT DOCUMENTS

| | | | | |
|---|---|---|---|---|
| 2010/0326637 A1* | 12/2010 | Sasaki | ............... | H01L 21/67109 165/138 |
| 2011/0269314 A1* | 11/2011 | Lee | .................. | H01L 21/67109 438/715 |
| 2012/0043062 A1* | 2/2012 | Tada | ................. | H01L 21/67109 165/138 |
| 2015/0294886 A1* | 10/2015 | Ravi | ................. | H01L 21/67109 165/80.3 |
| 2016/0189994 A1* | 6/2016 | Sasaki | ................ | H01L 21/6833 361/234 |
| 2016/0204009 A1* | 7/2016 | Nguyen | ............ | H01L 21/67109 165/80.4 |
| 2016/0314997 A1* | 10/2016 | Reuter | .............. | H01L 21/67109 |
| 2016/0378092 A1* | 12/2016 | Yamamoto | ........... | G05B 19/404 700/300 |
| 2017/0092471 A1* | 3/2017 | Wakai | ............... | H01L 21/67109 |

FOREIGN PATENT DOCUMENTS

| | | |
|---|---|---|
| JP | 2009-182235 | 8/2009 |
| KR | 10-2010-0116593 A | 11/2010 |

\* cited by examiner

SUBSTRATE COOLING METHOD, SUBSTRATE TRANSFER METHOD, AND LOAD-LOCK MECHANISM

CROSS-REFERENCE TO RELATED APPLICATION

This application claims priority to Japanese Patent Application No. 2015-209766 filed on Oct. 26, 2015, the entire contents of which are incorporated herein by reference.

FIELD OF THE INVENTION

The disclosure relates to a substrate cooling method in a load-lock mechanism used in a substrate processing system for processing a substrate in a vacuum state, a substrate transfer method, and the load-lock mechanism.

BACKGROUND OF THE INVENTION

In a semiconductor device manufacturing process, vacuum processing such as film formation, etching or the like is performed on a semiconductor wafer (hereinafter, referred to as "wafer") as a target substrate under a vacuum atmosphere. Recently, in view of improvement of efficiency of the vacuum processing and suppression of oxidation or contamination, there is used a cluster tool type multi-chamber substrate processing system in which a plurality of vacuum processing units is connected to a transfer chamber in a vacuum state and a wafer is transferred to each of the vacuum processing units by a transfer unit provided in the transfer chamber (see, e.g., Japanese Patent Application Publication No. 2000-208589).

In the multi-chamber processing system, a load-lock mechanism, which can be switched between an atmospheric atmosphere and a vacuum atmosphere, is provided between the transfer chamber in the vacuum state and a wafer cassette in an atmospheric atmosphere, and the wafer is transferred between the wafer cassette and the transfer chamber via the load-lock mechanism.

As for a film forming process, a process of heating a wafer to a high temperature of 200° C. or above, e.g., 500° C., may be performed as in the case of employing a CVD (Chemical Vapor Deposition) method. When the multi-chamber processing system is applied to the high temperature process, a high-temperature wafer is transferred from the vacuum processing unit into a chamber of the load-lock mechanism. When the high-temperature wafer is exposed to the atmosphere, the wafer is oxidized. Further, when the high-temperature wafer is accommodated in a container, the container that is generally made of a resin is melted.

Therefore, a cooling plate having a cooling unit for cooling a wafer is provided in the chamber of the load-lock mechanism, and the wafer is positioned near the cooling plate to be cooled by the latter while the inner state of the chamber of the load-lock mechanism is returned from the vacuum state to the atmospheric pressure (see, e.g., Japanese Patent Application Publication No. 2009-182235).

If the high-temperature wafer unloaded from the vacuum processing unit is cooled rapidly, the wafer may be warped due to a thermal expansion difference between a top surface and a backside of the wafer. Therefore, Japanese Patent Application Publication No. 2009-182235 discloses a technique that stops a pressure increase and separate the wafer away from the cooling plate when warpage of the wafer occurs in the load-lock mechanism.

Recently, the wafer is easily warped due to complicated devices formed on the wafer. Further, the warpage of the wafer often occurs before the wafer is loaded into the load-lock mechanism. Accordingly, it is required to effectively cool the wafer while effectively straightening the warped wafer in the load-lock mechanism.

SUMMARY OF THE INVENTION

In view of the above, the disclosure provides a load-lock mechanism capable of effectively cooling a substrate while effectively straightening the warped substrate, a substrate cooling method in the load-lock mechanism, and a substrate transfer method.

In accordance with a first aspect of the present invention, there is provided a substrate cooling method for cooling a high-temperature substrate transferred between a first module and a second module by using a load-lock mechanism for controlling a pressure between a first pressure and a second pressure in the case of transferring the substrate from the second module maintained at the second pressure in a vacuum state to the first module maintained at the first pressure close to an atmospheric pressure, the load-lock mechanism including a chamber accommodating a substrate, a cooling member provided in the chamber and configured to cool the substrate, a gas exhaust unit configured to exhaust the chamber, and a purge gas inlet unit configured to introduce a purge gas into the chamber, the method including: maintaining a pressure in the chamber to the second pressure, allowing the chamber to communicate with the second module, and loading the high-temperature substrate into the chamber; locating the substrate to a cooling position close to the cooling member; exhausting the chamber such that the pressure in the chamber becomes a third pressure at which a region between a surface of the cooling plate and a backside of the wafer satisfies a molecular flow condition; and introducing a purge gas into the chamber, increasing the pressure in the chamber to the first pressure, and cooling the substrate by heat transfer from the cooling member.

In accordance with a second aspect of the present invention, there is provided a substrate transfer method for, by using a load-lock mechanism for controlling a pressure therein between a first pressure and a second pressure in the case of transferring the substrate between a first module maintained at a first pressure close to an atmospheric pressure and a second module maintained at a second pressure in a vacuum state, transferring a high-temperature substrate from the second module to the first module the load-lock mechanism including a chamber accommodating a substrate, a cooling member provided in the chamber and configured to cool the substrate disposed close to the cooling member, a gas exhaust unit configured to exhaust the chamber, and a purge gas inlet unit configured to introduce a purge gas into the chamber, the method including: maintaining a pressure in the chamber to the second pressure, allowing the chamber to communicate with the second module, and loading the high-temperature substrate into the chamber; locating the substrate to a cooling position close to the cooling member; exhausting the chamber such that the pressure in the chamber becomes a third pressure at which a region between a surface of the cooling member and a backside of the substrate satisfies a molecular flow condition; introducing a purge gas into the chamber to increase the pressure in the chamber to the first pressure, and cooling the substrate by heat transfer from the cooling member; and transferring the substrate cooled to a predetermined temperature to the second module.

In accordance with a third aspect of the present invention, there is provided a load-lock mechanism for controlling a pressure therein between a first pressure and a second pressure in the case of transferring a substrate between a first module maintained at a first pressure close to an atmospheric pressure and a second module maintained at a second pressure in a vacuum state, including: a chamber accommodating a substrate; a cooling member provided in the chamber and configured to cool the substrate disposed close thereto; a gas exhaust unit configured to exhaust the chamber; a purge gas inlet unit configured to introduce a purge gas into the chamber; a communicating unit configured to allow the chamber to communicate with any one of the first module and the second module; and a control unit configured to control respective components of the load-lock mechanism, wherein when a high-temperature substrate is transferred from the second module to the first module, the control unit performs processes including: maintaining a pressure in the chamber at the second pressure, allowing the chamber to communicate with the second module, and loading the high-temperature substrate into the chamber; locating the substrate to a cooling position close to the cooling member; exhausting the chamber such that the pressure in the chamber becomes a third pressure at which a region between a surface of the cooling member and a backside of the substrate satisfies a molecular flow condition; and introducing a purge gas into the chamber to increase the pressure in the chamber to the first pressure, and cooling the substrate by heat transfer from the cooling member.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described in detail with respect to the accompanying drawings.

(Substrate Processing System)

Figure 1:
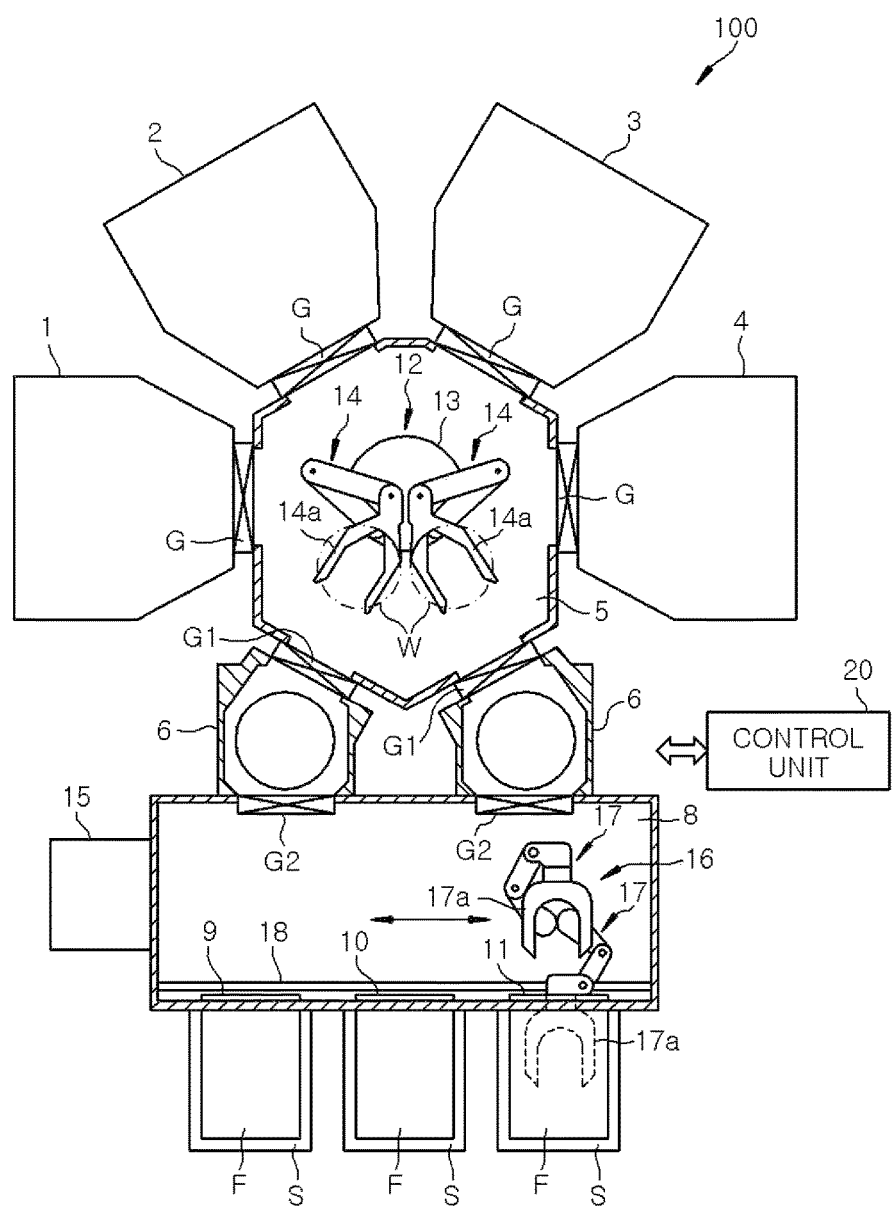
FIG. 1 is a horizontal cross sectional view schematically showing a multi-chamber type substrate processing system including a load-lock mechanism to which a substrate cooling method according to an embodiment is applied.

FIG. 1 is a horizontal cross sectional view schematically showing a multi-chamber type substrate processing system including a load-lock mechanism to which a substrate cooling method according to an embodiment is applied.

A substrate processing system 100 performs high-temperature processing, such as film formation using a CVD method, on a substrate. The substrate processing system 100 is suitable for processing of a substrate at 200° C. or above. A target substrate is not particularly limited. In the following description, a case where a semiconductor wafer (wafer) is used as the substrate will be described as an example.

As shown in FIG. 1, the substrate processing system 100 includes four processing units 1 to 4 for performing the high-temperature processing on the wafer W. The processing units 1 to 4 are respectively provided at walls, corresponding to four sides, of a hexagonal transfer chamber 5. In the processing units 1 to 4, predetermined high-temperature processing is performed on the wafer W, as a target substrate, mounted on a processing plate. Two load-lock mechanisms 6 are respectively connected to the other walls of the transfer chamber 5. The number of the load-lock mechanisms 6 may be one or three or more.

A loading/unloading chamber 8 is connected to sides of the two load-lock mechanisms 6 which are opposite to the sides connected to the transfer chamber 5. Ports 9 to 11 to which three carriers C, each being capable of accommodating wafers W as target substrates, are connected are provided at a side of the loading/unloading chamber 8 which is opposite to the side connected to the load-lock mechanisms 6. A filter (not shown) for forming a downflow of clean air is provided at an upper portion of the loading/unloading chamber 8.

As shown in FIG. 1, the processing units 1 to 4 are connected to the walls of the transfer chamber 5 through gate valves G. The processing units 1 to 4 communicate with the transfer chamber 5 by opening the corresponding gate valves G and are isolated from the transfer chamber 5 by closing the corresponding gate valves G. The two load-lock mechanisms 6 are connected to the other walls of the transfer chamber 5 through first gate valves G1 and connected to the loading/unloading chamber 8 through second gate valves G2.

A transfer unit 12 for loading and unloading the wafer W to and from the processing units 1 to 4 and the load-lock mechanism 6 is provided in the transfer chamber 5. The transfer unit 12 has a base 13 provided substantially at the center of the transfer chamber 5 and two multi-joint arms 14 of which base end portions are connected to the base 13. The wafer W is transferred while being supported by a hand 14a formed at a leading end of the multi-joint arm 14. The transfer chamber 5 is exhausted by a vacuum pump (not shown) and maintained at a predetermined vacuum level.

Shutters (not shown) are respectively provided at the ports 9 to 11 serving as wafer receiving vessels of the loading/unloading chamber 8. FOUPs F, each accommodating wafers W or being empty, are connected to the ports 9 to 11 while being mounted on stages S. The shutters are opened when the FOUPs F are connected, so that the FOUPs F communicate with the loading/unloading chamber 8 while preventing infiltration of exterior air. An alignment chamber 15 in which the wafer W is aligned is provided at a side surface of the loading/unloading chamber 8.

Provided in the loading/unloading chamber 8 is a transfer unit 16 for transferring the wafer W between the FOUPs F and the load-lock mechanisms 6. The transfer unit 16 has two multi-joint arms 17 movable on a rail along the arrangement direction of the FOUPs F. The transfer unit 16 transfers the wafer W while holding the wafer W on a hand 17a provided at a leading end of the arm 17.

The respective components of the substrate processing system 100, e.g., the processing units 1 to 4, the transfer chamber 5, a gas supply system and a gas exhaust system in the load-lock mechanism 6, the transfer units 12 and 16, the gate valves and the like, are controlled by a control unit 20 having a micro processor (computer). The control unit 20 includes a storage unit storing a processing recipe that is a control parameter and a process sequence of the vacuum processing system, an input device, a display and the like. The control unit 20 controls the vacuum processing system in accordance with a selected processing recipe.

(Load-Lock Mechanism)

Figure 2:
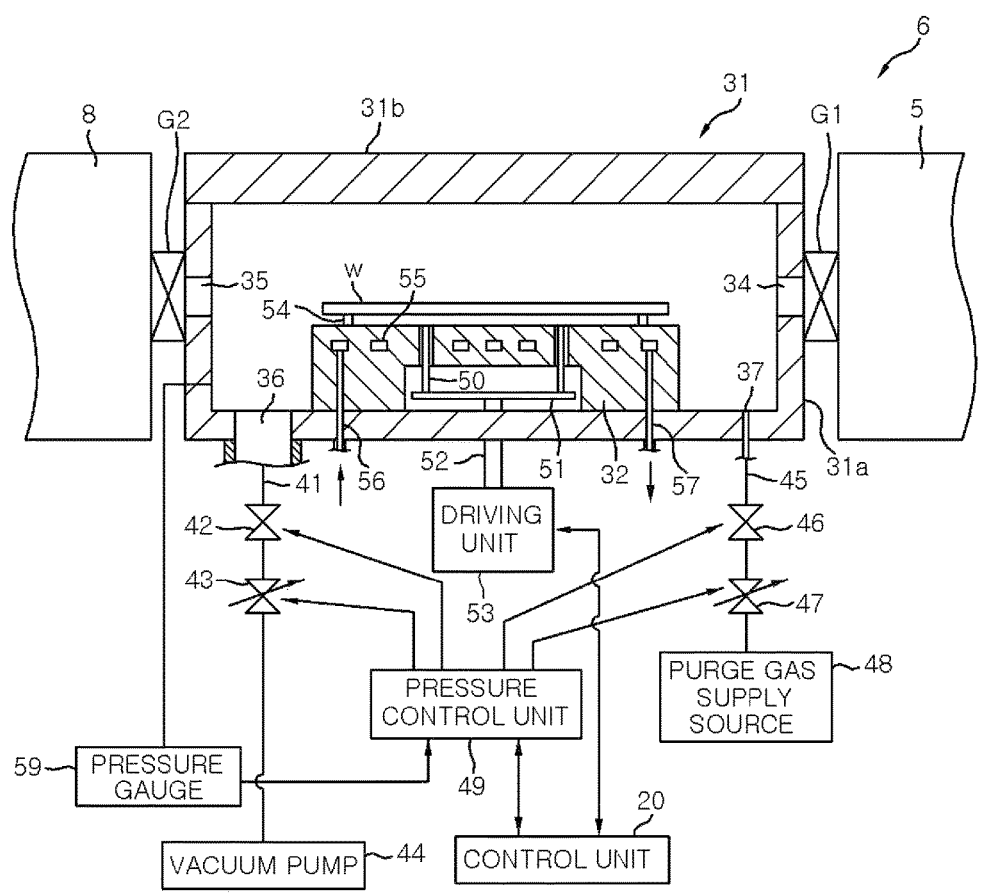
FIG. 2 is a vertical cross sectional view showing the load-lock mechanism in the substrate processing system shown in FIG. 1.
Figure 3:
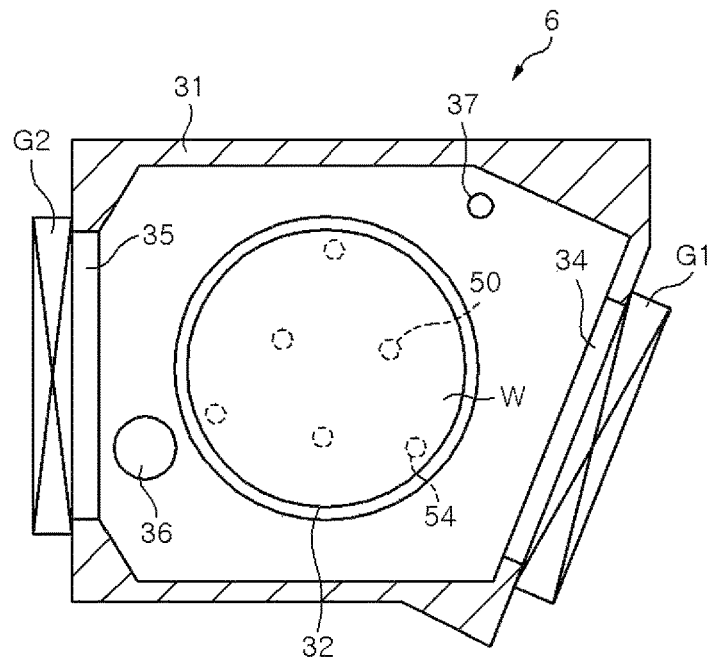
FIG. 3 is a horizontal cross sectional view showing the load-lock mechanism in the substrate processing system shown in FIG. 1.

Hereinafter, the load-lock mechanism 6 will be described in detail. FIGS. 2 and 3 show a vertical cross sectional view and a horizontal cross sectional view of the load-lock mechanism, respectively. As can be seen from FIGS. 2 and 3, the load-lock mechanism 6 includes a chamber 31. The chamber 31 has a main body 31a having an upper opening and a lid 31b for covering the upper opening of the main body 31a. At a bottom portion of the chamber 31, there is provided a cooling plate (cooling member) 32 for cooing a wafer W that is disposed near the cooling plate 32. The chamber 31 and the cooling plate 32 are made of, e.g., aluminum or aluminum alloy.

An opening 34 capable of communicating with the transfer chamber 5 maintained at a vacuum level is formed in one sidewall of the chamber 31. An opening 35 capable of communicating with the loading/unloading chamber 8 maintained at a first pressure (atmospheric pressure) that is a highest pressure is formed in the opposite sidewall. The opening 34 can be opened and closed by the first gate valve G1. The opening 35 can be opened and closed by the second gate valve G2.

Formed in the bottom portion of the chamber 31 are a gas exhaust port 36 for vacuum-evacuating the chamber 31 and a purge gas inlet port 37 for introducing a purge gas (e.g., $N_2$ gas). The gas exhaust port 36 is connected to a gas exhaust line 41. Installed in the gas exhaust line 41 are an opening/closing valve 42, a gas exhaust rate control valve 43 and a vacuum pump 44. The purge gas inlet port 37 is connected to a purge gas supply line 45 extended from a purge gas supply source 48. Installed in the purge gas supply line 45 are an opening/closing valve 46 and a flow rate control valve 47.

When the wafer W is transferred between the chamber 31 and the transfer chamber 5 of the vacuum side, the chamber 31 is exhausted through the gas exhaust line 41 by the vacuum pump 44 at a predetermined rate controlled by the gas exhaust rate control valve 43 by closing the opening/closing valve 46 and opening the opening/closing valve 42. The pressure in the chamber 31 is controlled to a second pressure corresponding to a pressure in the transfer chamber 5. In that state, the first gate valve G1 is opened and the chamber 31 and the transfer chamber 5 communicate with each other. When the wafer W is transferred between the chamber 31 and the loading/unloading chamber 8 of the atmospheric side, the purge gas such as $N_2$ gas or the like is introduced into the chamber 31 from the purge gas supply source 48 through the purge gas supply line 45 at a flow rate controlled by the flow rate control valve 47 by closing the opening/closing valve 42 and opening the opening/closing valve 46. The pressure in the chamber 31 is controlled to the first pressure close to the atmospheric pressure. In that state, the second gate valve G2 is opened and the chamber 31 is allowed to communicate with the loading/unloading chamber 8. As will be described later, a pressure in the chamber 31 can be controlled to a third pressure lower than the second pressure in order to straighten the warped wafer W.

The pressure in the chamber 31 is controlled between an atmospheric pressure and a vacuum atmosphere by a pressure control unit 49. The pressure control unit 49 controls the pressure in the chamber 31 by controlling the opening/closing valve 42, the gas exhaust rate control valve 43, the flow rate control valve 47 and the opening/closing valve 46 based on a pressure in the chamber 31 which is measured by a pressure gauge 59. The pressure control valve 49 is controlled by the control unit 20.

Three (only two are shown in FIG. 2) wafer elevating pins 50 for transferring the wafer W are provided at the cooling plate 32 so as to protrude beyond and retract below the surface (top surface) of the cooling plate 32. The wafer elevating pins 50 are fixed to a supporting plate 51. Further, the wafer elevating pins 50 are vertically moved through the supporting plate 51 by vertically moving a rod 52 by a driving unit 53 such as a motor, an air cylinder or the like. The wafer elevating pins 50 can be moved between a raised position above the surface (top surface) of the cooling plate 32 where the wafer W is delivered and a lowered position below the top surface of the cooling plate 32. When the wafer elevating pins 50 are located at the raised position, the hands 14a of the multi-joint arm 14 in the transfer unit 12 or the hands 17a of the multi-joint arm 17 in the transfer unit 16 are inserted into the chamber 31 and the wafer W is transferred between any one of the hands and the wafer elevating pins 50. Three (only two are shown in FIG. 2) wafer supporting pins 54 are provided at the top surface of the cooling plate 32. By lowering the wafer elevating pins 50 having thereon the wafer W to the lowered position, the wafer W is mounted on the wafer supporting pins 54 and made to be located at the cooling position close to the cooling plate 32. Since the wafer W is not in direct contact with the top surface of the cooling plate 32, the adhesion of particles to the backside of the wafer W can be reduced. A distance from the surface of the cooling plate 32 to the backside of the wafer at this time is preferably within a range from 0.2 mm to 1 mm, e.g., 0.3 mm.

A cooling medium path 55 is formed in the cooling plate 32. The cooling medium path 55 is connected to a cooling medium inlet line 56 and a cooling medium discharge line 57. A cooling medium such as cooling water or the like is supplied from a cooling medium supply unit (not shown), so that the wafer W close to the cooling plate 32 can be cooled. A temperature of the cooling plate 32 is controlled to, e.g., 25° C., by the cooling medium.

(Operation of the Substrate Processing System)

Hereinafter, an operation of the substrate processing system configured as described above will be described.

First, a wafer W is unloaded from the FOUP F connected to the loading/unloading chamber 8 by the transfer unit 16 and loaded into the chamber 31 of any one of the load-lock mechanisms 6 (see FIG. 2). At this time, the purge gas is introduced into the chamber 31 of the load-lock mechanism 6 and the pressure in the chamber 31 is controlled to the first pressure (atmospheric pressure). Then, the second gate valve G2 is opened and the wafer W is loaded by the transfer unit 16.

When the pressure in the chamber 31 reaches the second pressure corresponding to the pressure in the transfer chamber 5 by vacuum-evacuating the chamber 31, the first gate valve G1 is opened and the wafer W is unloaded from the chamber 31 by the hand 14a of the transfer unit 12. Next, the gate valve G of any one of the processing units 1 to 4 is opened and the wafer W on the hand 14a is loaded into the corresponding processing unit. In the corresponding processing unit, the wafer W is subjected to high-temperature vacuum processing such as CVD film formation or the like.

After the vacuum processing in the processing unit is completed, the chamber 31 of any one of the load-lock mechanisms 6 is vacuum-evacuated to the second pressure corresponding to the pressure in the transfer chamber 5. Then, the first gate valve G1 of the load-lock mechanism 6 is opened and the processed wafer W is loaded into the chamber 31 of the load-lock mechanism 6.

The wafer W loaded into the chamber 31 of the load-lock mechanism 6 has a high temperature. Thus, the wafer W on the hand 14a of the one of the multi-joint arms 14 of the transfer unit 12 is delivered onto the wafer elevating pins 50 by raising the wafer elevating pins 50 to the raised position and then made to be located at the cooling position on the wafer supporting pins 54 above the cooling plate 32 by lowering the wafer elevating pins 50 to the lowered position. The purge gas is introduced into the chamber 31 and the pressure in the chamber 31 is increased to the first pressure (atmospheric pressure) corresponding to the transfer pressure to the loading/unloading chamber 8. At this time, the wafer W in the chamber 31 is cooled by cold heat transferred through the purge gas.

The wafer W unloaded from the processing units 1 to 4 is rapidly cooled from a high-temperature state and thus may be warped due to a thermal expansion difference between the top surface and the backside thereof. The warped wafer W needs to be straightened in the load-lock mechanism 6.

In order to straighten the warped wafer W, in a conventional case, the wafer W is held on the pins for a predetermined period of time in the airtightly sealed chamber 31 of the load-lock mechanism 6 before the wafer elevating pins 50 are lowered. However, such a technique is disadvantageous in that it is difficult to sufficiently straighten the warped wafer W within a request time and the processing time of the wafer W in the load-lock mechanism 6 is increased to sufficiently straighten the warped wafer W.

Therefore, in the present embodiment, the wafer W is cooled in the following manner. First, the wafer W is loaded into the chamber 31 in a state where the pressure in the chamber 31 of the load-lock mechanism 6 is controlled to the second pressure same as the pressure in the transfer chamber 5. Then, when the wafer W is made to be located at the cooling position close to the cooling plate 32, the chamber 31 is exhausted (vacuum-evacuated) such that the pressure in the chamber 31 becomes the third pressure at which a region between the cooling plate 32 and the backside of the wafer W satisfies a molecular flow condition. Next, the pressure is maintained for a predetermined period of time and, then, the purge gas is introduced into the chamber 31 to cool the wafer W.

The molecular flow denotes a flow in which a mean free path λ of a molecule in a rarefied gas flow is smaller than a representative length L of the flow. In other words, it means a flow that satisfies Kn>1 on the assumption that the Knudsen number Kn satisfies Kn=λ/L. In the present embodiment, L indicates a distance from the surface of the cooling plate 32 to the backside of the wafer in the cooling position. For example, the distance L is 0.3 mm.

In the molecular flow region, gas molecules hardly collide with each other and almost directly move between the surface of the cooling plate 32 and the backside of the wafer W. Therefore, the amount of heat transferred through the gas is proportional to the number of gas molecules, i.e., a pressure. In the molecular flow region, the number of gas molecules that transfer heat energy is extremely small, so that the thermal conduction is extremely small. Accordingly, the region between the surface of the cooling plate 32 and the backside of the wafer W can be substantially insulated by controlling the region therebetween to satisfy the molecular flow condition.

By maintaining the pressure in the chamber 31 at the third pressure at which the region between the surface of the cooling plate 32 and the backside of the wafer W satisfies the molecular flow condition, the wafer W is insulated and the cooling of the wafer W by heat transfer hardly occurs. Further, since heat is exchanged inside the wafer W and the wafer W is close to the cooling plate 32 having thermal uniformity, the uniformity of the temperature is promoted. Accordingly, the warped wafer W can be straightened sufficiently within a short period of time. Further, since the wafer W is close to the cooling plate 32, the cooling by radiation also occurs. The pressure is increased by introducing the purge gas into the chamber 31 in a state where the wafer W becomes thermally uniform and sufficiently straightened. Thus, the wafer W can be cooled with high efficiency and the cooling time can be shortened. In order to further increase the heat insulating effect, it is preferable to set the third pressure to be 10 Pa or less.

In the continuous flow (viscous flow) region where the condition Kn<1 is satisfied, when the pressure is changed, the number of gas molecules that transfer the heat energy is changed and, also, the mean free path is changed. Therefore, the amount of heat transferred through the gas does not depend on the pressure and the region between the surface of the cooling plate 32 and the backside of the wafer W has a constant thermal conductivity. Accordingly, it is difficult to obtain the heat insulating effect provided by the molecular flow condition.

Figure 4:
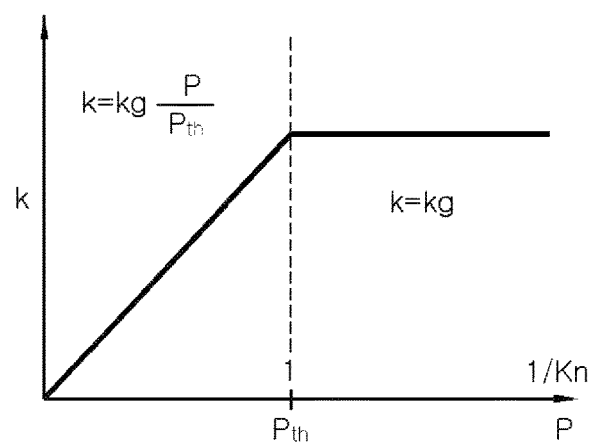
FIG. 4 shows relation between a pressure P and a thermal conductivity k in a molecular flow region and a continuous flow region.

FIG. 4 shows relation between the pressure P and the thermal conductivity k in the molecular flow region and the continuous flow region. A pressure $P_{th}$ is set to a threshold, and a region where a pressure is higher than $P_{th}$ becomes the continuous flow region. In the continuous flow region, the thermal conductivity k is constant and satisfies k=kg. On the other hand, in the molecular flow region where a pressure is lower than $P_{th}$, the thermal conductivity k is proportional to the pressure P and satisfies k=kg×(P/$P_{th}$).

In the case of using $N_2$ gas as a purge gas, $P_{th}$ may be determined by the following Eq. (1).

$$P_{th}[\text{Pa}] = \frac{k_B T}{\sqrt{2}\,\pi\sigma^2 L} \approx 2.27 \times 10^{-5} \frac{T[K]}{L[m]} \qquad (1)$$

where $k_B$ indicates Boltzmann constant, σ indicates a diameter of an $N_2$ molecule, nσ² indicates a cross sectional area of collision. From the Eq. (1), at a wafer temperature T of 500° C. (773K), $P_{th}$ becomes 100 Pa when the distance L between the top surface of the cooling plate 32 and the backside of the wafer W is 0.1755 mm, 10 Pa when the distance L is 1.755 mm, and 1 Pa when the distance L is 17.55 mm. When the distance L is 0.3 mm as in the above example, $P_{th}$ becomes 58.5 Pa.

In a conventional CVD film formation, a pressure in the transfer chamber is about 20 Pa to 200 Pa and preferably about 100 Pa to 200 Pa. When the wafer is loaded into the load-lock mechanism, a pressure in the chamber of the load-lock mechanism is set to such a range. However, at such a pressure range, the region between the surface of the cooling plate and the backside of the wafer satisfies the continuous flow condition. In that case, it is difficult to ensure the heat insulating state obtained in the present embodiment. Further, since the wafer W is held in a raised state, it is difficult to maintain thermal uniformity. Therefore, in the conventional case, it is difficult to straighten the warped wafer within a short period of time and the purge gas is introduced in a state where the warped wafer is not sufficiently straightened. It is known that when a displacement difference between the center and the edge of the wafer is greater than 0.7 mm, the wafer may be warped due to sudden introduction of the purge gas. Accordingly, in the conventional case, it is required to perform slow purge in an initial stage of the purge gas introduction, which makes it difficult to increase the cooling efficiency.

On the other hand, in the present embodiment, the wafer W is made to be located near the cooling plate 32 and, then, a pressure in the chamber 31 is maintained at the third pressure at which the region between the surface of the cooling plate 32 and the backside of the wafer W satisfies the molecular flow condition. As a consequence, it is possible to sufficiently straighten the warped wafer W and reduce the displacement difference between the edge and the center to 0.7 mm or less. Therefore, even if a large amount of purge gas is introduced in the initial stage of the purge gas introduction, the wafer is not warped and the cooling efficiency can be extremely increased. Further, due to a small displacement difference (warpage) between the edge and the center of the wafer, the distance between the surface of the cooling plate 32 and the backside of the wafer W becomes uniform in the surface of the wafer W. As a result, the cold heat from the cooling plate 32 can be received by the entire backside of the wafer W, which makes it possible to improve the cooling efficiency.

(Specific Example of Cooling Sequence in Load-Lock Mechanism)

Figure 5:
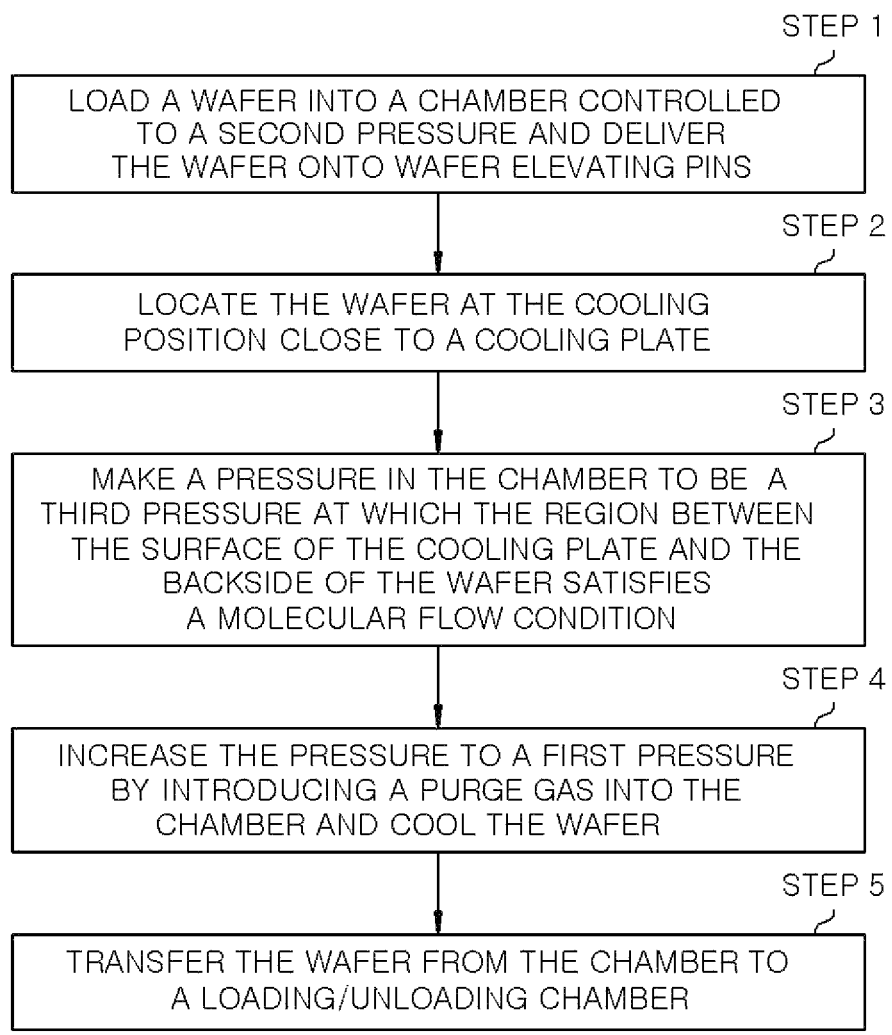
FIG. 5 is a flowchart for explaining a specific example of a cooling sequence in the load-lock mechanism.
Figure 6:
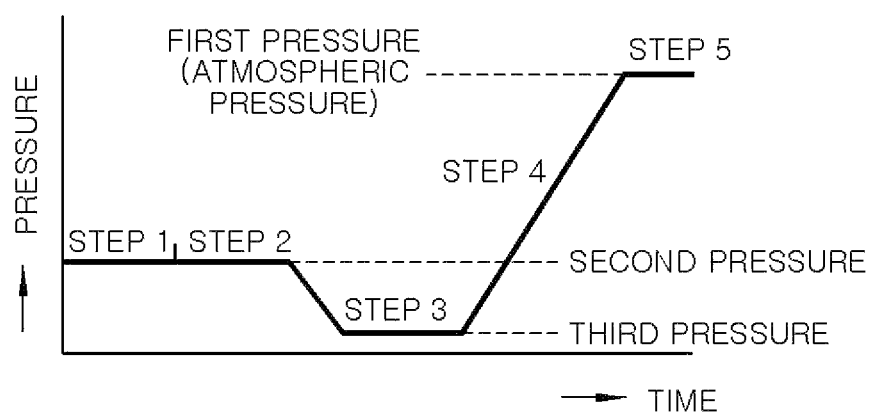
FIG. 6 shows pressure changes in a chamber in the cooling sequence shown in FIG. 5.

Hereinafter, a specific example of the cooling sequence in the load-lock mechanism will be described. FIG. 5 is a flowchart for explaining the corresponding sequence. FIG. 6 shows pressure changes in the chamber at that time.

First, a pressure in the chamber 31 is controlled to the second pressure (20 Pa to 200 Pa and preferably 100 Pa to 200 Pa) same as the pressure in the transfer chamber 5 and the gate valve G1 is opened. The wafer elevating pins 50 are raised to the raised position. The wafer W that has been subjected to a high-temperature film forming process in any one of the processing units is loaded into the chamber 31 by the transfer unit 12 (the hand 14a of the multi-joint arm 14) and delivered onto the wafer elevating pins 50 (step 1). A temperature of the wafer W at this time is preferably 200° C. or above.

Next, the gate valve G1 is closed and the wafer elevating pins 50 are lowered to the lowered position. The wafer W is mounted on the wafer supporting pins 54 on the top surface of the cooling plate 32 and made to be located at the cooling position close to the cooling plate 32 (step 2). At this time, a distance from the surface of the cooling plate 32 to the backside of the wafer W is preferably 0.2 mm to 1 mm, e.g., 0.3 mm.

Then, the chamber 31 is exhausted (vacuum-evacuated) by the vacuum pump 44 such that a pressure in the chamber 31 becomes the third pressure at which the region between the surface of the cooling plate 32 and the backside of the wafer W satisfies the molecular flow condition (step 3). At this time, the vacuum pump 44 is stopped and the chamber 31 is exhausted to a pressure of 58.5 Pa or less when the distance L from the surface of the cooling plate 32 and the backside of the wafer W is 0.3 mm. Thus, the wafer W is insulated and hardly cooled. The heat is exchanged inside the wafer W and the wafer W close to the cooling plate 32 in a thermally uniform state has a uniform temperature. As a result, as described above, the warped wafer W is straightened. The holding time at this time is preferably 5 sec to 60 sec. In order to further increase the heat insulating effect, it is preferable to set the third pressure to be 10 Pa or less.

As long as the wafer W mounted on the wafer supporting pins 54 is held at a predetermined pressure for a predetermined period of time, the vacuum evacuation in the step 3 may be started in a state where the wafer W is placed on the wafer elevating pins 50 in a raised position or during the downward movement of the wafer W by the wafer elevating pins 50.

After the vacuum evacuation is completed, the purge gas (e.g., $N_2$ gas) is introduced into the chamber 31 and the pressure in the chamber 31 is increased to the first pressure (atmospheric pressure) corresponding to the transfer pressure to the loading/unloading chamber 8. At this time, the wafer W is cooled by heat transfer from the cooling plate 32 (step 4).

When the wafer W is cooled to a predetermined temperature in the load-lock mechanism 6 and the cooling is completed, the gate valve G2 is opened and the wafer W is raised by the wafer elevating pins 50. Then, the wafer W is transferred from the chamber 31 to the loading/unloading chamber 8 by the hand 17a of the multi-joint arm 17 in the transfer unit 16 (step 5). Thereafter, the wafer W on the hand 17a is transferred to one of the FOUPs F.

In a conventional case, a single vacuum pump can deal with a plurality of load-lock mechanisms. However, in the present embodiment, vacuum evacuation needs to be performed when the processed wafer returns and, thus, it is required to provide a plurality of vacuum pumps so that a processed wafer can be vacuum-attracted in one of the load-lock mechanisms when an unprocessed wafer vacuum-evacuation is performed in another load-lock mechanism for an unprocessed wafer.

(Test Example)

Hereinafter, a result of a test on straightening of a warped wafer in the case of cooling the wafer in various sequences by using the load-lock mechanism will be described.

In this case, the wafer is warped in a convex shape, and temporal changes in the displacement between the center and the edge in the case of holding an outer peripheral portion of the wafer are monitored. When the displacement difference between the center and the edge of the wafer is decreased, the warpage amount is reduced. Therefore, it is determined the straightening of the warped wafer W is satisfactory when one of the center and the edge is rapidly converged to the other.

Figure 7A:
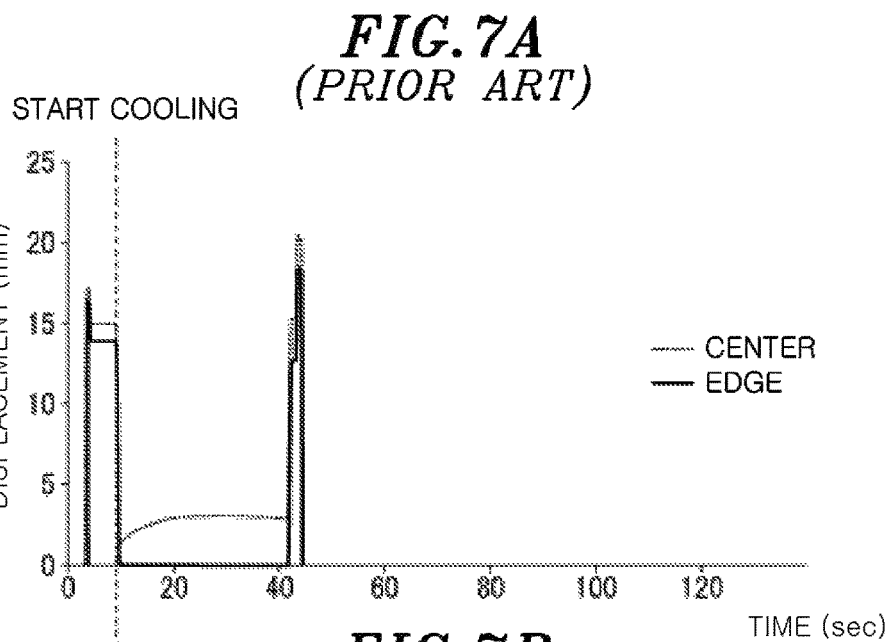
FIGS. 7A to 7C show displacement of a wafer at a center and an edge in the case of cooling the wafer by a conventional cooling sequence.
Figure 7B:
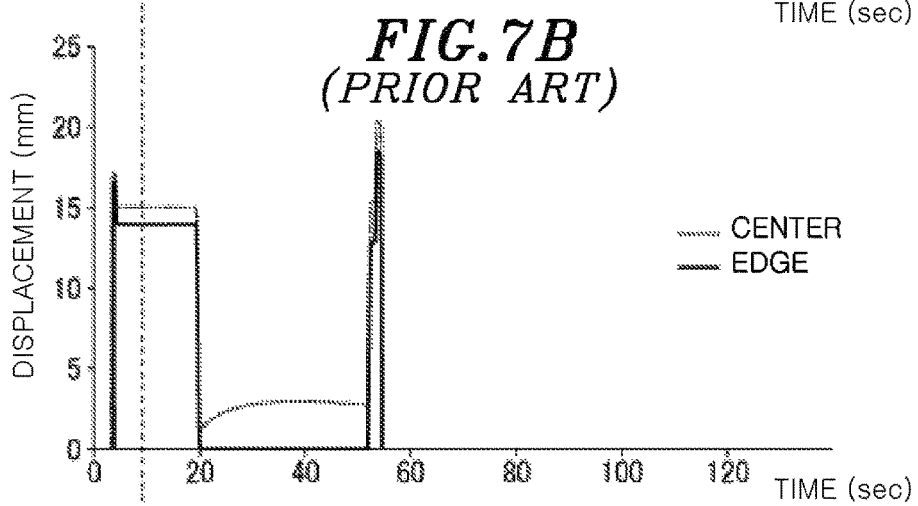
Figure 7C:
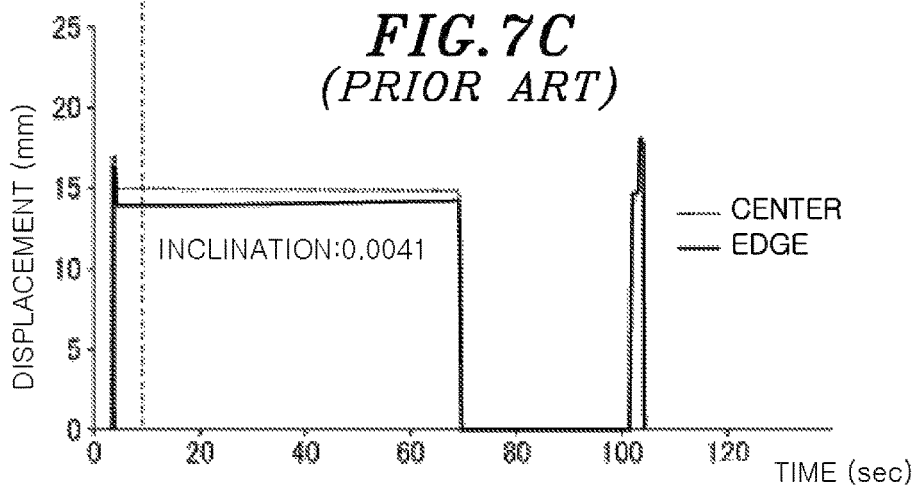
Figure 8A:
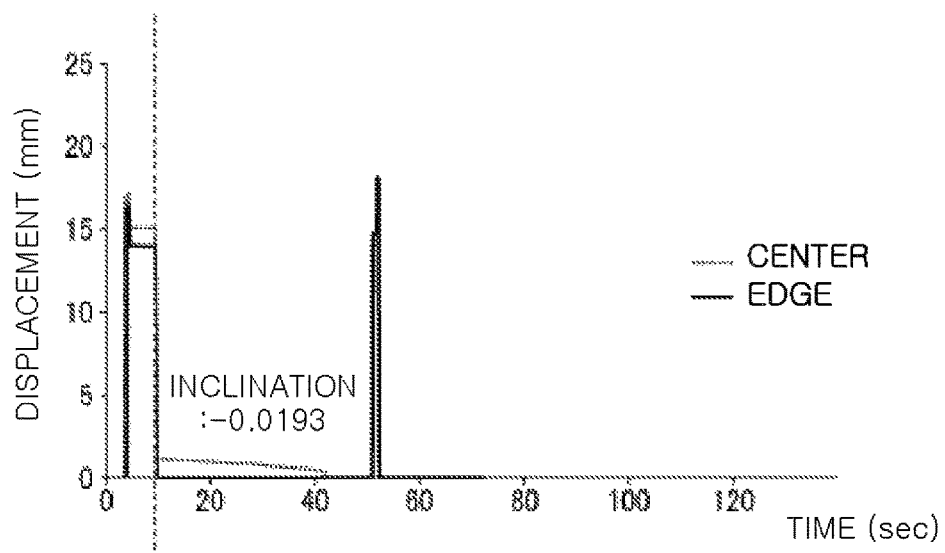
FIGS. 8A and 8B show displacement of a wafer at a center and an edge in the case of cooling the wafer by a cooling sequence of the embodiment.
Figure 8B:
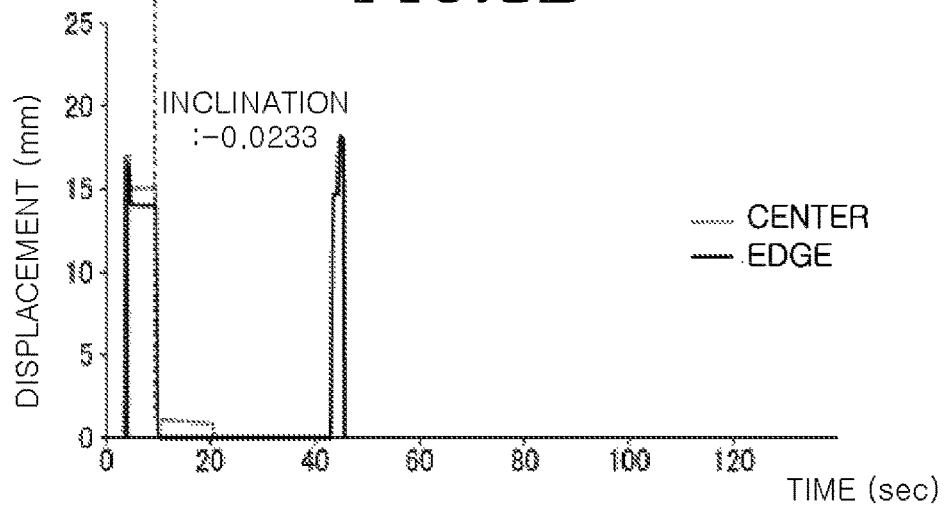

FIGS. 7A to 7C show a conventional example. FIGS. 8A and 8B show an example of the present embodiment.

FIG. 7A shows the case in which a wafer straightening process is not performed. In this case, the wafer is loaded into the chamber of the load-lock mechanism and made to be located close to the cooling plate by lowering the wafer elevating pins. Then, slow purge is performed for 10 sec and main purge is performed for 19 sec. The displacement difference between the center and the edge of the wafer is large, and this indicates that the warped wafer is not straightened.

On the other hand, FIG. 7B shows the case in which after the wafer is held for 10 sec while being mounted on the wafer elevating pins in a raised position in order to suppress warpage of the wafer, the wafer is made to be located near the cooling plate by lowering the wafer elevating pins and, then, the slow purge and the main purge are performed for 10 sec and 19 sec, respectively. The warpage amount of the wafer at this time is substantially the same as that in the case shown in FIG. 7A, and the straightening effect is hardly obtained.

FIG. 7C shows the case in which after vacuum-evacuation is performed and the wafer is held for 60 sec while being mounted on the wafer elevating pins in a raised state in order to suppress warpage of the wafer, the wafer is made to be located close to the cooling plate by lowering the wafer elevating pins and, then, the slow purge and the main purge are performed for 10 sec and 19 sec, respectively. In this case, although the warped wafer is straightened to a certain extent, the convergence slope is small and the cooling time is extremely long, which is not effective.

On the other hand, FIGS. 8A and 8B show the cases in which the wafer located close to the cooling plate is held at a pressure that satisfies the molecular flow condition for 25 sec and 10 sec, respectively, and then the main purge is performed for 19 sec. In both cases, the center is rapidly converged on the edge and the warped wafer is straightened within a short period of time.

(Other Applications)

The disclosure can be variously modified without being limited to the above embodiment. For example, in the above embodiment, the example in which the disclosure is applied to the multi-chamber type vacuum processing system including four vacuum processing units and two load-lock mechanisms has been described. However, the disclosure is not limited to such a system and may also be applied to, e.g., a system including a single vacuum processing unit and a single load-lock mechanism, as long as a high-temperature substrate can be cooled by the load-lock mechanism and transferred to another module. The target substrate is not limited to a semiconductor wafer and may be another substrate such as a glass substrate for FPD or the like.

While the disclosure has been shown and described with respect to the embodiments, it will be understood by those skilled in the art that various changes and modifications may be made without departing from the scope of the disclosure as defined in the following claims.

What is claimed is:

1. A substrate cooling method for, by using a load-lock mechanism for controlling a pressure therein between a first pressure and a second pressure in the case of transferring the substrate between a first module maintained at a first pressure close to an atmospheric pressure and a second module maintained at a second pressure in a vacuum state, cooling a high-temperature substrate transferred from the second module to the first module, the load-lock mechanism including a chamber accommodating a substrate, a cooling member disposed in the chamber and configured to cool the substrate disposed proximate to the cooling member, a gas exhaust unit configured to exhaust the chamber, and a purge gas inlet unit configured to introduce a purge gas into the chamber, the method comprising:
    maintaining a pressure in the chamber to the second pressure, allowing the chamber to communicate with the second module, and loading the high-temperature substrate into the chamber;
    placing the substrate to a cooling position close to the cooling member;
    exhausting the chamber to a third pressure at which a region between a surface of the cooling member and a backside of the substrate satisfies a molecular flow condition to obtain uniform temperature distribution of the substrate; and
    after maintaining the third pressure in the chamber at the third pressure for a first duration, introducing a purge gas into the chamber to increase the pressure in the chamber to the first pressure, and cooling the substrate by using the cooling member.

2. The substrate cooling method of claim 1, wherein a temperature of the high-temperature substrate is 200° C. or above.

3. The substrate cooling method of claim 1, wherein in the cooling position, a distance between the surface of the cooling member and the backside of the substrate is within a range from 0.2 mm to 1 mm.

4. The substrate cooling method of claim 1, wherein the first duration of maintaining the pressure in the chamber at the third pressure is in a range of 5 sec to 60 sec.

5. The substrate cooling method of claim 1, wherein the second pressure is within a range from 20 Pa to 200 Pa.

6. The substrate cooling method of claim 1, wherein the cooling member is controlled to a predetermined temperature by circulating a cooling medium therethrough.

7. A substrate transfer method for, by using a load-lock mechanism for controlling a pressure therein between a first pressure and a second pressure in the case of transferring the substrate between a first module maintained at a first pressure close to an atmospheric pressure and a second module maintained at a second pressure in a vacuum state, transferring a high-temperature substrate from the second module to the first module, the load-lock mechanism including a chamber accommodating a substrate, a cooling member disposed in the chamber and configured to cool the substrate disposed proximate the cooling member, a gas exhaust unit configured to exhaust the chamber, and a purge gas inlet unit configured to introduce a purge gas into the chamber, the method comprising:
    maintaining a pressure in the chamber to the second pressure, allowing the chamber to communicate with the second module, and loading the high-temperature substrate into the chamber;
    placing the substrate to a cooling position close to the cooling member;
    exhausting the chamber to a third pressure at which a region between a surface of the cooling member and a backside of the substrate satisfies a molecular flow condition to obtain uniform temperature distribution of the substrate;
    after maintaining the pressure in the chamber at the third pressure for a first duration, introducing a purge gas into the chamber to increase the pressure in the chamber to the first pressure, and cooling the substrate by using the cooling member; and
    transferring the substrate cooled to a predetermined temperature to the first module.

8. The substrate transfer method of claim 7, wherein a temperature of the high-temperature substrate is 200° C. or above.

9. The substrate transfer method of claim 7, wherein in the cooling position, a distance between the surface of the cooling member and the backside of the substrate is within a range from 0.2 mm to 1 mm.

10. The substrate transfer method of claim 7, wherein the first duration of maintaining the pressure in the chamber at the third pressure is in the range of 5 sec to 60 sec.

11. The substrate transfer method of claim 7, wherein the second pressure is within a range from 20 Pa to 200 Pa.

12. The substrate transfer method of claim 7, wherein the cooling member is controlled to a predetermined temperature by circulating a cooling medium therethrough.

13. A load-lock mechanism for controlling a pressure therein between a first pressure and a second pressure in the case of transferring a substrate between a first module maintained at a first pressure close to an atmospheric pressure and a second module maintained at a second pressure in a vacuum state, comprising:
 a chamber accommodating a substrate;
 a cooling member provided in the chamber and configured to cool the substrate disposed proximate to the cooling member;
 a gas exhaust unit configured to exhaust the chamber;
 a purge gas inlet unit configured to introduce a purge gas into the chamber;
 a communicating unit configured to allow the chamber to communicate with any one of the first module and the second module; and
 a control unit configured to control respective components of the load-lock mechanism,
 wherein when a high-temperature substrate is transferred from the second module to the first module, the control unit performs processes including;
  maintaining a pressure in the chamber at the second pressure, allowing the chamber to communicate with the second module, and loading the high-temperature substrate into the chamber;
  placing the substrate to a cooling position close to the cooling member;
  exhausting the chamber to a third pressure at which a region between a surface of the cooling member and a backside of the substrate satisfies a molecular flow condition to obtain uniform temperature distribution of the substrate; and
  after maintaining the pressure in the chamber at the third pressure for a predetermined duration, introducing a purge gas into the chamber to increase the pressure in the chamber to the first pressure, and cooling the substrate by heat transfer from the cooling member.

14. The substrate transfer method of claim 1, wherein the third pressure is lower than the second pressure.

15. The substrate transfer method of claim 7, wherein the third pressure is lower than the second pressure.

16. The load-lock mechanism for controlling a pressure of claim 13, wherein the third pressure is lower than the second pressure.

* * * * *